(12) United States Patent
Tsuji

(10) Patent No.: US 12,490,499 B2
(45) Date of Patent: Dec. 2, 2025

(54) SILICON CARBIDE SEMICONDUCTOR DEVICE

(71) Applicant: FUJI ELECTRIC CO., LTD., Kawasaki (JP)

(72) Inventor: Takashi Tsuji, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 385 days.

(21) Appl. No.: 18/325,695

(22) Filed: May 30, 2023

(65) Prior Publication Data

US 2024/0021720 A1 Jan. 18, 2024

(30) Foreign Application Priority Data

Jul. 14, 2022 (JP) ................. 2022-113056

(51) Int. Cl.
| | | |
|---|---|---|
| *H01L 29/78* | (2006.01) | |
| *H10D 30/66* | (2025.01) | |
| *H10D 62/17* | (2025.01) | |
| *H10D 62/832* | (2025.01) | |
| *H10D 84/00* | (2025.01) | |

(52) U.S. Cl.
CPC ......... *H10D 84/144* (2025.01); *H10D 30/668* (2025.01); *H10D 62/393* (2025.01); *H10D 62/8325* (2025.01)

(58) Field of Classification Search
None
See application file for complete search history.

(56) References Cited

U.S. PATENT DOCUMENTS

2009/0289264 A1  11/2009  Matsuki et al.
2022/0199823 A1*  6/2022  Baba ............... H10D 62/8325

FOREIGN PATENT DOCUMENTS

JP  2009283540 A  12/2009

* cited by examiner

*Primary Examiner* — William C Trapanese
(74) *Attorney, Agent, or Firm* — Rabin & Berdo, P.C.

(57) ABSTRACT

$P^{++}$-type contact regions are disposed apart from one another, and in a $p^-$-type base region, at least hole current regions directly beneath the contact regions have an impurity concentration of not more than $5\times10^{16}/cm^3$. A $p^+$-type region for mitigating electric field and disposed between adjacent gate trenches is separated into first portions in contact with the hole current regions and second portions in contact with only a portion of the base region other than the hole current regions. During conduction of body diodes, forward current flows into an $n^-$-type drain region through the contact regions, the hole current regions, and the first portions. Thus, in the drain region, holes from the base region are injected only into hole injection regions that are directly beneath the first portions, but are not injected into regions that respectively surround peripheries of the hole injection regions.

6 Claims, 14 Drawing Sheets

SILICON CARBIDE SEMICONDUCTOR DEVICE

CROSS REFERENCE TO RELATED APPLICATIONS

This application is based upon and claims the benefit of priority of the prior Japanese Patent Application No. 2022-113056, filed on Jul. 14, 2022, the entire contents of which are incorporated herein by reference.

BACKGROUND OF THE INVENTION

1. Field of the Invention

Embodiments of the invention relate to a silicon carbide semiconductor device.

2. Description of the Related Art

In general, a metal oxide semiconductor field effect transistor (MOSFET) having an insulated gate with a three-layer structure including a metal, an oxide film, and a semiconductor has body diodes built into a semiconductor substrate thereof. The body diodes of the MOSFET are parasitic p-intrinsic-n (pin) diodes formed by pn junctions between $p^{++}$-type contact regions, a p-type base region, an $n^-$-type drift region, and an $n^+$-type drain region.

A structure of a conventional silicon carbide semiconductor device containing silicon carbide (SiC) as a semiconductor material is described. FIG. 13 is a cross-sectional view depicting the structure of the conventional silicon carbide semiconductor device. FIG. 14 is a plan view depicting a layout when a portion of the conventional silicon carbide semiconductor device is viewed from a front side of a semiconductor substrate thereof. FIG. 13 depicts the structure along cutting line AA-AA' in FIG. 14. In FIG. 14, a p-type base region 104 and $n^+$-type source regions 105 are not depicted to clearly depict the layout of $p^{++}$-type contact regions 106 and $p^+$-type regions 121, 122.

A conventional silicon carbide semiconductor device 110 depicted in FIGS. 13 and 14 is a vertical SiC-MOSFET having, in a semiconductor substrate 130 containing silicon carbide, a trench gate structure at a front surface (main surface having a $p^-$-type epitaxial layer 133) of the semiconductor substrate 130. In the semiconductor substrate 130, epitaxial layers 132, 133 constituting an $n^-$-type drift region 102 and a $p^-$-type base region 103, respectively, are sequentially formed by epitaxial growth on an $n^+$-type starting substrate 131 that contains silicon carbide. The $n^+$-type starting substrate 131 constitutes an $n^+$-type drain region 101.

A portion of the $n^-$-type epitaxial layer 132, excluding the later-described $p^+$-type regions 121, 122 and n-type current spreading regions 123 formed in the $n^-$-type epitaxial layer 132 by ion implantation, constitutes the $n^-$-type drift region 102. A portion of the $p^-$-type epitaxial layer 133, excluding the later-described p-type base region 104, the later-described $n^+$-type source regions 105, and the later-described $p^{++}$-type contact regions 106 formed in the $p^-$-type epitaxial layer 133 by ion implantation, constitutes the $p^-$-type base region 103.

The trench gate structure is configured by the $p^-$-type base region 103, the p-type base region 104, the $n^+$-type source regions 105, the $p^{++}$-type contact regions 106, gate trenches 107, gate insulating films 108, and gate electrodes 109. Body diodes 120 of the SiC-MOSFET are formed by pn junctions 134 between the $p^{++}$-type contact regions 106, the $p^-$-type base region 103, the p-type base region 104, the later-described $p^+$-type regions 121, 122, the later-described n-type current spreading regions 123, the $n^-$-type drift region 102, and the $n^+$-type drain region 101.

The gate trenches 107 extend in a striped pattern in a first direction X that is parallel to the front surface of the semiconductor substrate 130. Between the gate trenches 107 that are adjacent to one another (in mesa portions), the $p^-$-type base region 103, the p-type base region 104, the $n^+$-type source regions 105, and the $p^{++}$-type contact regions 106 are selectively provided. The $p^-$-type base region 103, the p-type base region 104, and the $n^+$-type source regions 105 are in contact with the gate insulating films 108 at sidewalls of the gate trenches 107, extend uninterrupted in the first direction X, and have a same length as that of the gate trenches 107.

The p-type base region 104 is positioned deeper from the front surface of the semiconductor substrate 130 than are the $n^+$-type source regions 105 and the $p^{++}$-type contact regions 106 (closer to the $n^+$-type drain region 101 (back surface of the semiconductor substrate 130)); the p-type base region 104 is further positioned shallower than the later-described $p^+$-type regions 122 and the later-described n-type current spreading regions 123 (closer to the $n^+$-type source regions 105 (front surface of the semiconductor substrate 130)) and is apart from these regions. The $p^-$-type base region 103 intervenes between the p-type base region 104 and these regions.

Between the front surface of the semiconductor substrate 130 and the $p^-$-type base region 103, the $n^+$-type source regions 105 and the $p^{++}$-type contact regions 106 are each selectively provided in contact with the $p^-$-type base region 103 and are in ohmic contact with a source electrode 112, at the front surface of the semiconductor substrate 130. The $p^{++}$-type contact regions 106 are apart from the gate trenches 107 and are adjacent to the $n^+$-type source regions 105 in a direction parallel to the front surface of the semiconductor substrate 130. In each of the mesa portions, the $p^{++}$-type contact regions 106 are disposed apart from one another at a predetermined pitch in the first direction X.

Between the $p^-$-type base region 103 and the $n^-$-type drift region 102, the $p^+$-type regions 121, 122, and the n-type current spreading regions 123 are each selectively provided closer to the $n^+$-type drain region 101 than are bottoms of the gate trenches 107. The n-type current spreading regions 123 are provided between and in contact with the $n^-$-type drift region 102, the $p^-$-type base region 103, and the $p^+$-type regions 121, 122. The n-type current spreading regions 123 reach the gate trenches 107 and are in contact with the gate insulating films 108.

The $p^+$-type regions 121, 122 extend linearly uninterrupted in the first direction X and have a same length as that of the gate trenches 107. The $p^+$-type regions 121 are apart from the $p^-$-type base region 103 and face the bottoms of the gate trenches 107 in a depth direction Z. The $p^+$-type regions 121 are electrically connected to the source electrode 112 by a non-depicted portion. Between the gate trenches 107 that are adjacent to one another, the $p^+$-type regions 122 are provided in contact with the $p^-$-type base region 103 and apart from the gate trenches 107 and the $p^+$-type regions 121.

At the front surface of the semiconductor substrate 130, the source electrode 112 is in ohmic contact with the $n^+$-type source regions 105 and the $p^{++}$-type contact regions 106 via contact holes of an interlayer insulating film 111, and is electrically connected to the $n^+$-type source regions 105, the $p^{++}$-type contact regions 106, the $p^-$-type base region 103, the p-type base region 104, and the p⁺-type regions 121, 122. A drain electrode 113 is provided in an entire area of the back surface (main surface of having the n⁺-type starting substrate 131) of the semiconductor substrate 130 and is electrically connected to the n⁺-type drain region 101.

In the conventional silicon carbide semiconductor device 110 described above, during normal operation, voltage that is positive with respect to the source electrode 112 is applied to the drain electrode 113 (state of forward bias between a drain and source), and the pn junctions 134 between the p⁺⁺-type contact regions 106, the p⁻-type base region 103, the p-type base region 104, the p⁺-type regions 121, 122, the n-type current spreading regions 123, the n⁻-type drift region 102, and the n⁺-type drain region 101 are reverse biased. Under this state, when the gate voltage is lower than the gate threshold voltage, the SiC-MOSFET maintains the off-state.

On the other hand, under a state of forward bias of between the drain and source, when a gate voltage that is at least equal to the gate threshold voltage is applied, a channel (n-type inversion layer) is formed at portions of the p⁻-type base region 103 and the p-type base region 104 along the sidewalls of the gate trenches 107. As a result, drift current (hole current) Ids flows from the n⁺-type drain region 101, through the n⁻-type drift region 102, the n-type current spreading regions 123, and the channel, to the n⁺-type source regions 105, whereby the SiC-MOSFET (silicon carbide semiconductor device 110) turns on.

Further, during dead time during synchronous rectification of SiC-MOSFETs and during energy regeneration to a load side by the SiC-MOSFET, between the drain and source is in a state of reverse bias. Thus, the pn junctions 134 between the p⁺⁺-type contact regions 106, the p⁻-type base region 103, the p-type base region 104, the p⁺-type regions 121, 122, the n-type current spreading regions 123, the n⁻-type drift region 102, and the n⁺-type drain region 101 are forward biased, the body diodes 120 conduct, and a forward current If flows through the body diodes 120.

As for a conventional trench-gate-type SiC-MOSFET, a device has been proposed in which p⁺-type regions are disposed adjacent to n⁺-type source regions in a depth direction, whereby punch-through of a p-type base region and the p⁺-type regions directly beneath the n⁺-type source regions is prevented and breakdown voltage between the drain and source is ensured (for example, refer to Japanese Laid-Open Patent Publication No. 2009-283540). Japanese Laid-Open Patent Publication No. 2009-283540 discloses that an impurity concentration of the p-type base region is in a range of $1.0 \times 10^{16}/\text{cm}^3$ to $1.0 \times 10^{18}/\text{cm}^3$ and an impurity concentration of the p⁺-type regions is in a range of $1.0 \times 10^{18}/\text{cm}^3$ to $1.0 \times 10^{21}/\text{cm}^3$.

SUMMARY OF THE INVENTION

According to an embodiment a silicon carbide semiconductor device includes: a semiconductor substrate containing silicon carbide and having a first main surface and a second main surface that are opposite to each other; a first semiconductor region of a first conductivity type, provided in the semiconductor substrate; a second semiconductor region of a second conductivity type, provided between the first main surface of the semiconductor substrate and the first semiconductor region; a third semiconductor region of the first conductivity type, selectively provided between the first main surface and the second semiconductor region; a plurality of fourth semiconductor regions of the second conductivity type, selectively provided between the first main surface and the second semiconductor region, the plurality of fourth semiconductor regions having an impurity concentration that is higher than an impurity concentration of the second semiconductor region; a trench penetrating through the third semiconductor region and the second semiconductor region and reaching the first semiconductor region; a gate insulating film provided in the trench; a gate electrode provided on the gate insulating film, in the trench; a first electrode electrically connected to the third semiconductor region and the second semiconductor region; and a second electrode electrically connected to the second main surface of the semiconductor substrate. The plurality of fourth semiconductor regions are disposed apart from one another in island-like shapes, and the second semiconductor region has a plurality of first regions, each of which faces at least a corresponding one of the plurality of fourth semiconductor regions in a depth direction, the impurity concentration in the plurality of first regions being not more than $5 \times 10^{16}/\text{cm}^3$.

Objects, features, and advantages of the present invention are specifically set forth in or will become apparent from the following detailed description of the invention when read in conjunction with the accompanying drawings.

DETAILED DESCRIPTION OF THE INVENTION

Figure 10:
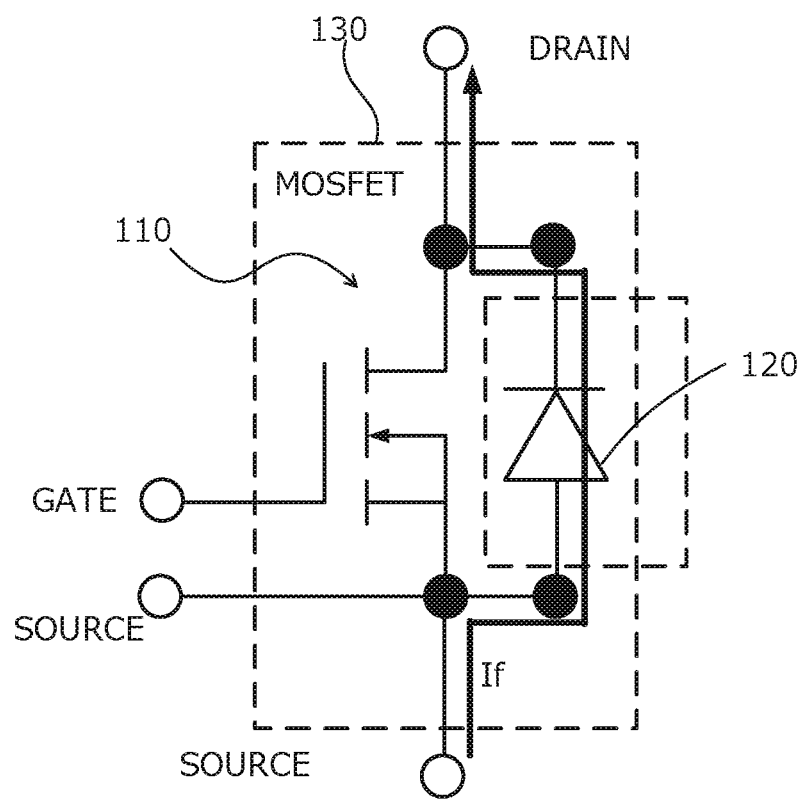
FIG. 10 is a circuit diagram depicting an equivalent diagram of FIG. 13.

First, problems associated with the conventional techniques are discussed. In the conventional silicon carbide semiconductor device 110 described above (refer to FIGS. 13 and 14), when the body diodes 120 conduct (forward conduction), so-called bipolar degradation (forward conduction degradation due to the body diodes 120) such as increases in on-voltage Von and/or forward voltage Vf occurs. Causes of bipolar degradation of a SiC-MOSFET are discussed. FIG. 10 is a circuit diagram depicting an equivalent diagram of FIG. 13. A portion of FIG. 10 surrounded by a dashed line corresponds to the silicon carbide semiconductor device 110 (the semiconductor substrate 130) in FIGS. 13 and 14.

Figure 11A:
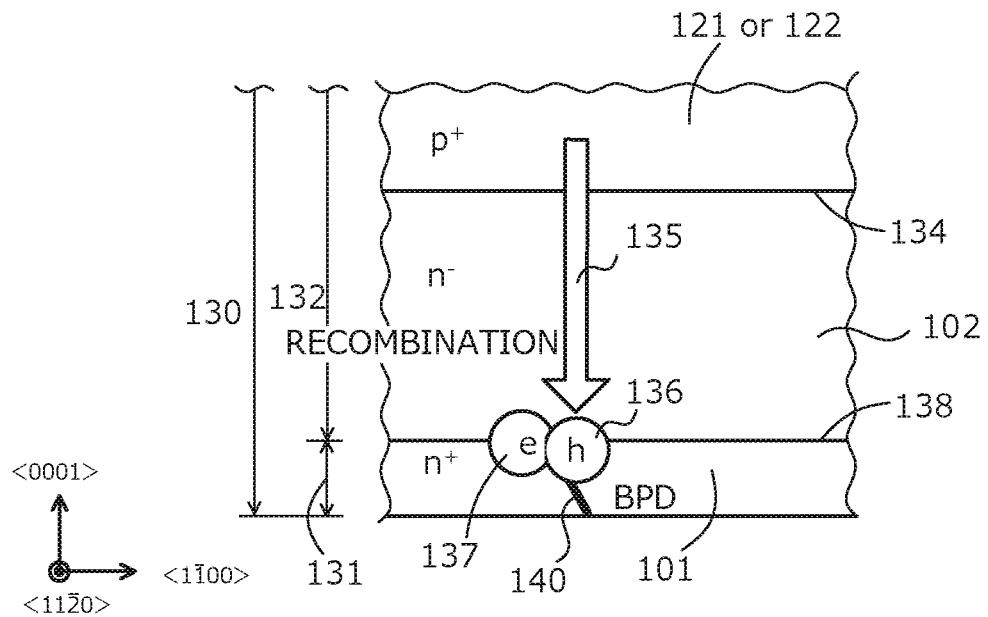
FIG. 11A is a diagram for describing bipolar degradation of a conventional silicon carbide semiconductor device.
Figure 11B:
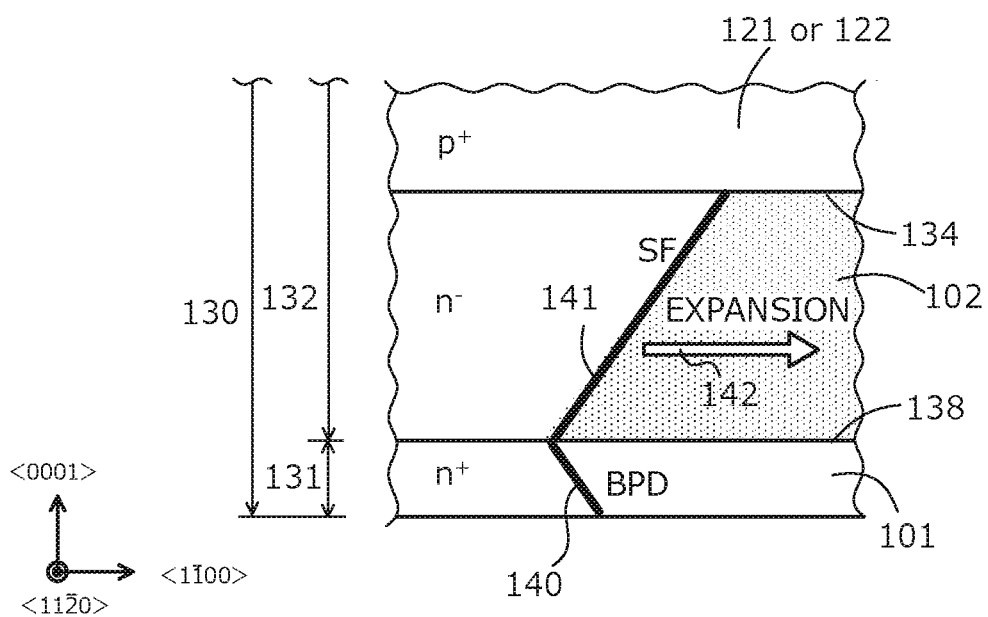
FIG. 11B is a diagram for describing the bipolar degradation of the conventional silicon carbide semiconductor device.
Figure 12:
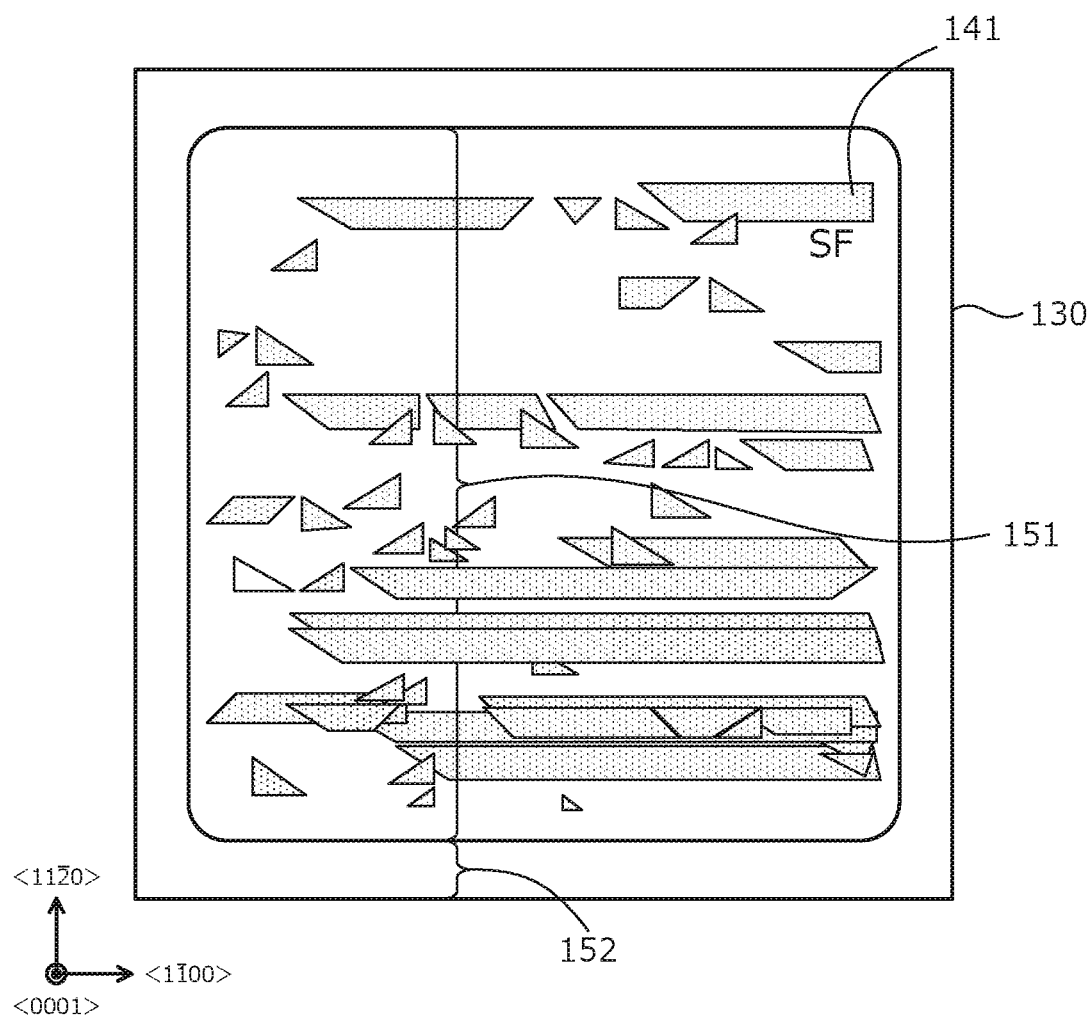
FIG. 12 is a plan view depicting a state of a semiconductor substrate overall when the semiconductor substrate in FIG. 11B is viewed from a front surface thereof.

FIGS. 11A and 11B are diagrams for describing the bipolar degradation of the conventional silicon carbide semiconductor device. FIGS. 11A and 11B are enlarged views of a portion (the n⁻-type drift region 102 and the n⁺-type drain region 101 close to the p⁺-type regions 122) of the semiconductor substrate 130 in FIG. 13. FIG. 11A depicts a state during conduction of the body diodes 120 and FIG. 11B depicts a state of an expansion 142 of a stacking fault 141 (bold line) in a <1-100> direction due to conduction of the body diodes 120. FIG. 12 is a plan view depicting a state of the semiconductor substrate overall when the semiconductor substrate in FIG. 11B is viewed from a front surface thereof.

Figure 13:
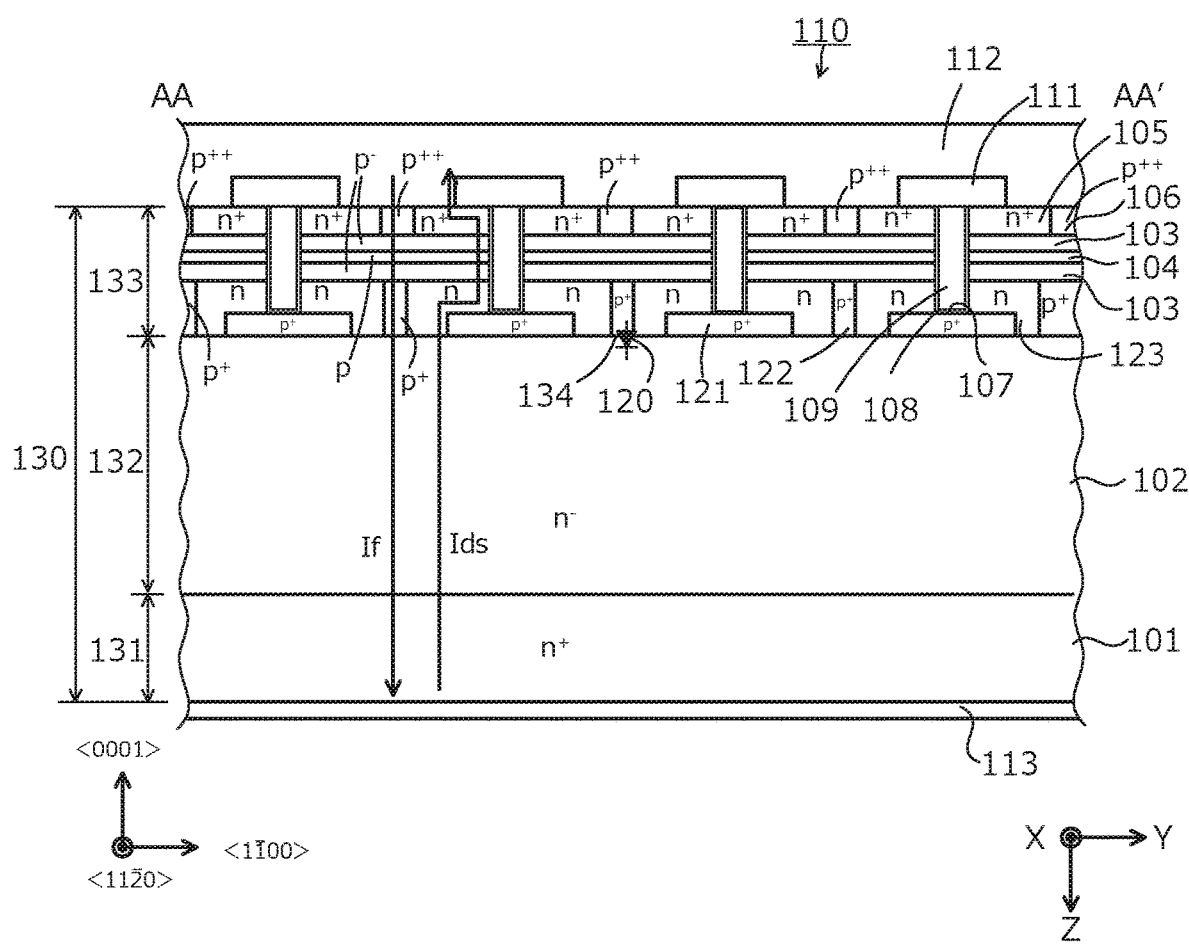
FIG. 13 is a cross-sectional view depicting the structure of the conventional silicon carbide semiconductor device.
Figure 14:
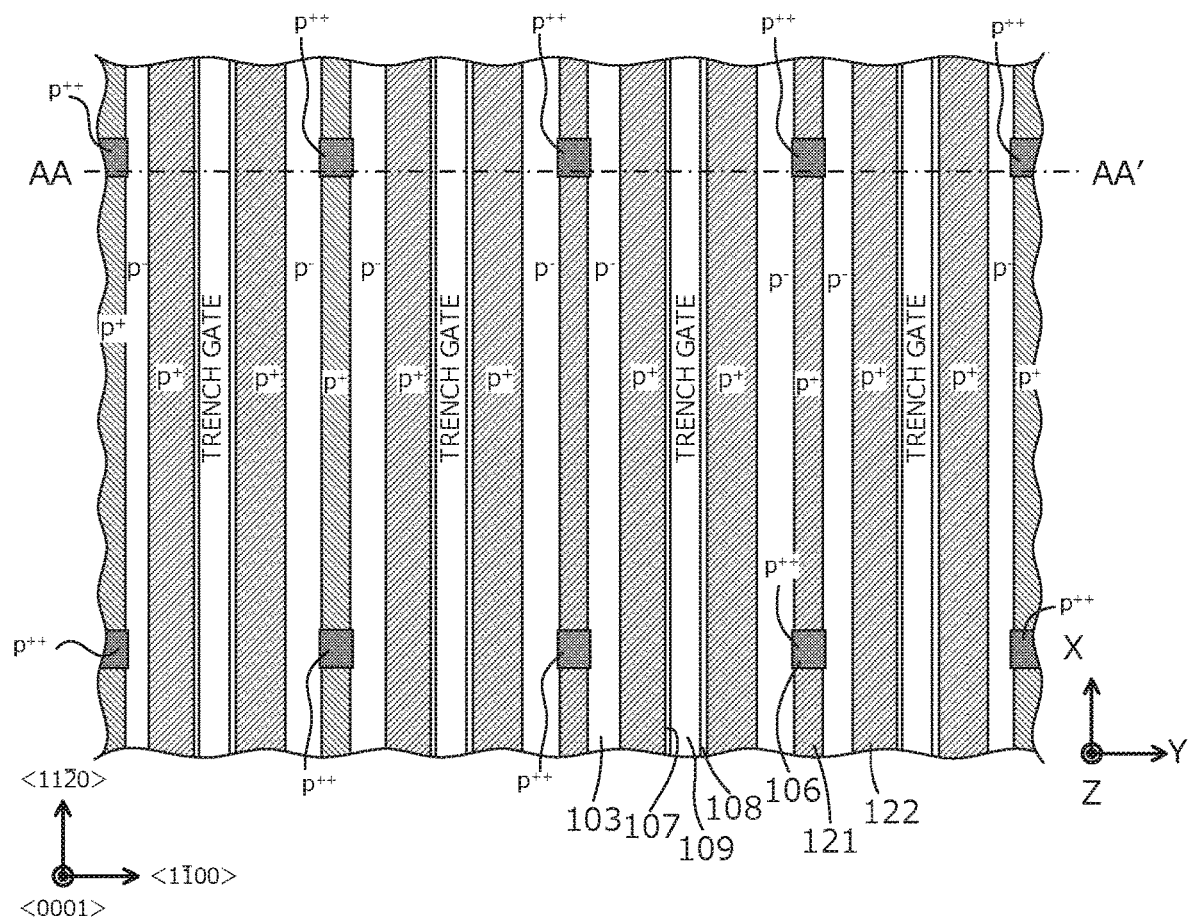
FIG. 14 is a plan view depicting a layout when a portion of the conventional silicon carbide semiconductor device is viewed from the front side of the semiconductor substrate thereof.

The body diodes 120 are connected in parallel between the drain and source (FIGS. 10 and 13). The forward current If of the body diodes 120 flows into the p⁻-type base region 103 from the p⁺⁺-type contact regions 106, and spreads in the p⁻-type base region 103 and the p-type base region 104 in a horizontal direction (direction parallel to the front surface of the semiconductor substrate 130). Thus, holes (indicated as "h" in the FIG. 136 are injected (injection 135) in substantially an entire area of the n⁻-type drift region 102 from the p⁻-type base region 103, via the p⁺-type regions 121, 122 (FIG. 11A).

The holes 136 injected (the injection 135) in the n⁻-type drift region 102 recombined with electrons (indicated as "e" in the FIG. 137 in the n⁻-type drift region 102 and due to this recombination, energy such as light close to the band gap of silicon carbide is emitted. A basal plane dislocation (BPD) 140 of the semiconductor substrate 130 receives this energy and grows along the (0001) plane in the n⁻-type epitaxial layer 132 and thereby, becomes the stacking fault (SF) 141.

The BPD 140 is present in a large number in the n⁺-type starting substrate 131 and in general, the BPDs 140 of the n⁺-type starting substrate 131 grow from an interface 138 with the n⁻-type epitaxial layer 132, into the n⁻-type drift region 102 (the n⁻-type epitaxial layer 132), along a (0001) plane, at an angle corresponding to an off-angle (normally, about 4 degrees) in a <11-20> direction along a (0001) plane in the n⁻-type drift region 102 (the n⁻-type epitaxial layer 132), the BPDs 140 become the stacking faults 141 and grow up to a vicinity of interfaces with the p⁺-type regions 121, 122. Further, the stacking faults 141 further expand in the n⁻-type drift region 102 in the <1-100> direction (the expansion 142) (hatched portions in FIGS. 11B and 12).

As described above, in the injection 135, the holes 136 are injected in substantially an entire area of the n⁻-type drift region 102, whereby in an entire area of the n⁻-type drift region 102 in an active region 151, holes are present at a critical concentration 1×10¹⁵/cm³ or greater. Thus, spanning an entire area of the active region 151, a large number of the BPDs 140 in the n⁺-type starting substrate 131 grow in the n⁻-type drift region 102, are converted into the stacking faults 141, and the stacking faults 141 expand in the n⁻-type drift region 102 in the <1-100> direction, to a border between the active region 151 and an edge termination region 152 (the expansion 142).

The stacking faults 141 constitute resistance components with respect to the electron flow (electron current). Thus, the greater is the number and the greater is the expansion of the stacking faults 141 in the n⁻-type drift region 102 of the active region 151, the greater is the resistance component of the electron flow (flow in a direction opposite to that of the drift current Ids, flow in a direction opposite to that of the forward current If) when SiC-MOSFET is on or during conduction of the body diodes 120, whereby conduction loss increases. As a result, increases in bipolar degradation (increases in the on-voltage Von and/or the forward voltage Vf) occur.

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
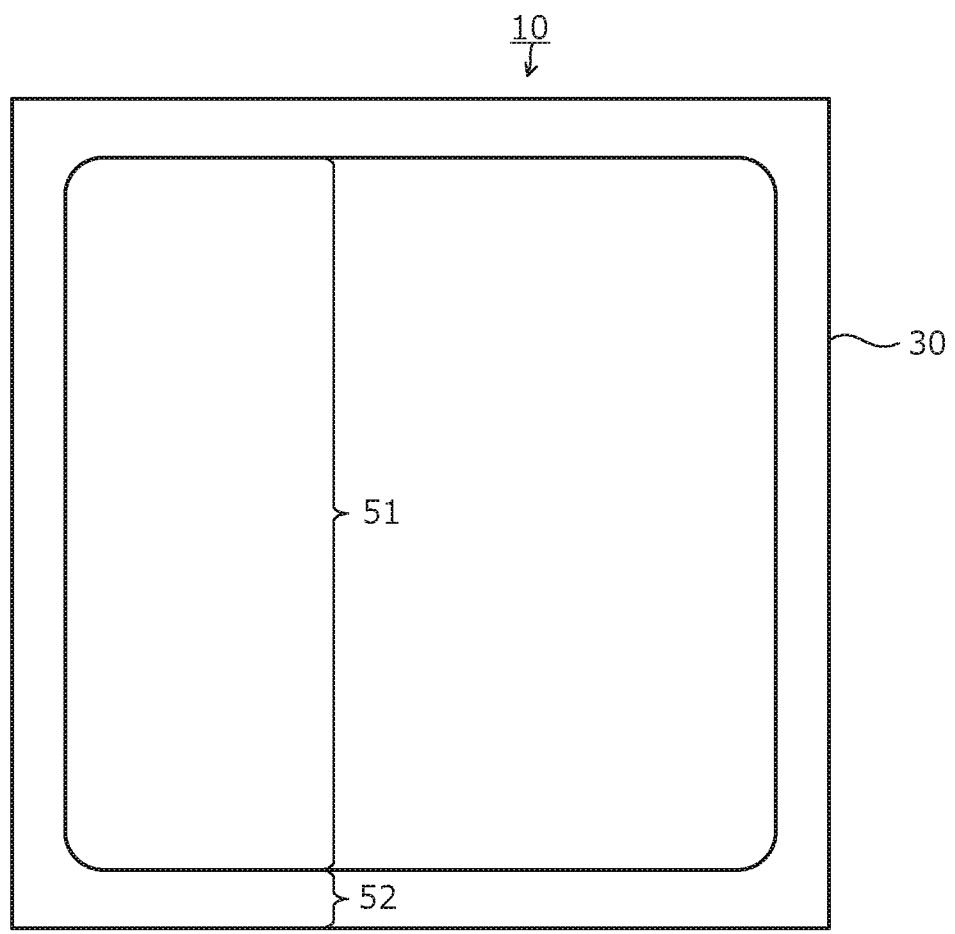
FIG. 1 is a plan view depicting a layout when a silicon carbide semiconductor device according to an embodiment is viewed from a front side of a semiconductor substrate thereof.
Figure 2:
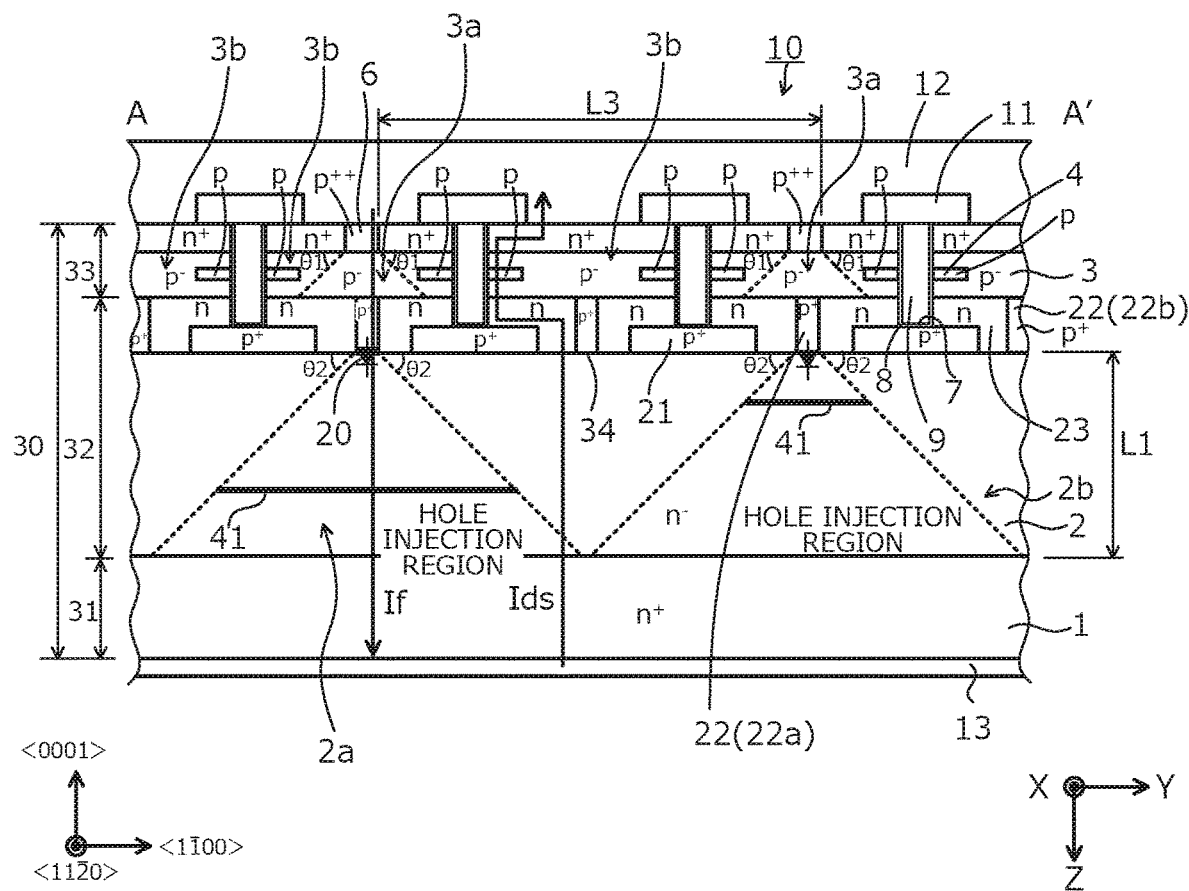
FIG. 2 is a cross-sectional view depicting a structure of the silicon carbide semiconductor device according to the embodiment.
Figure 3:
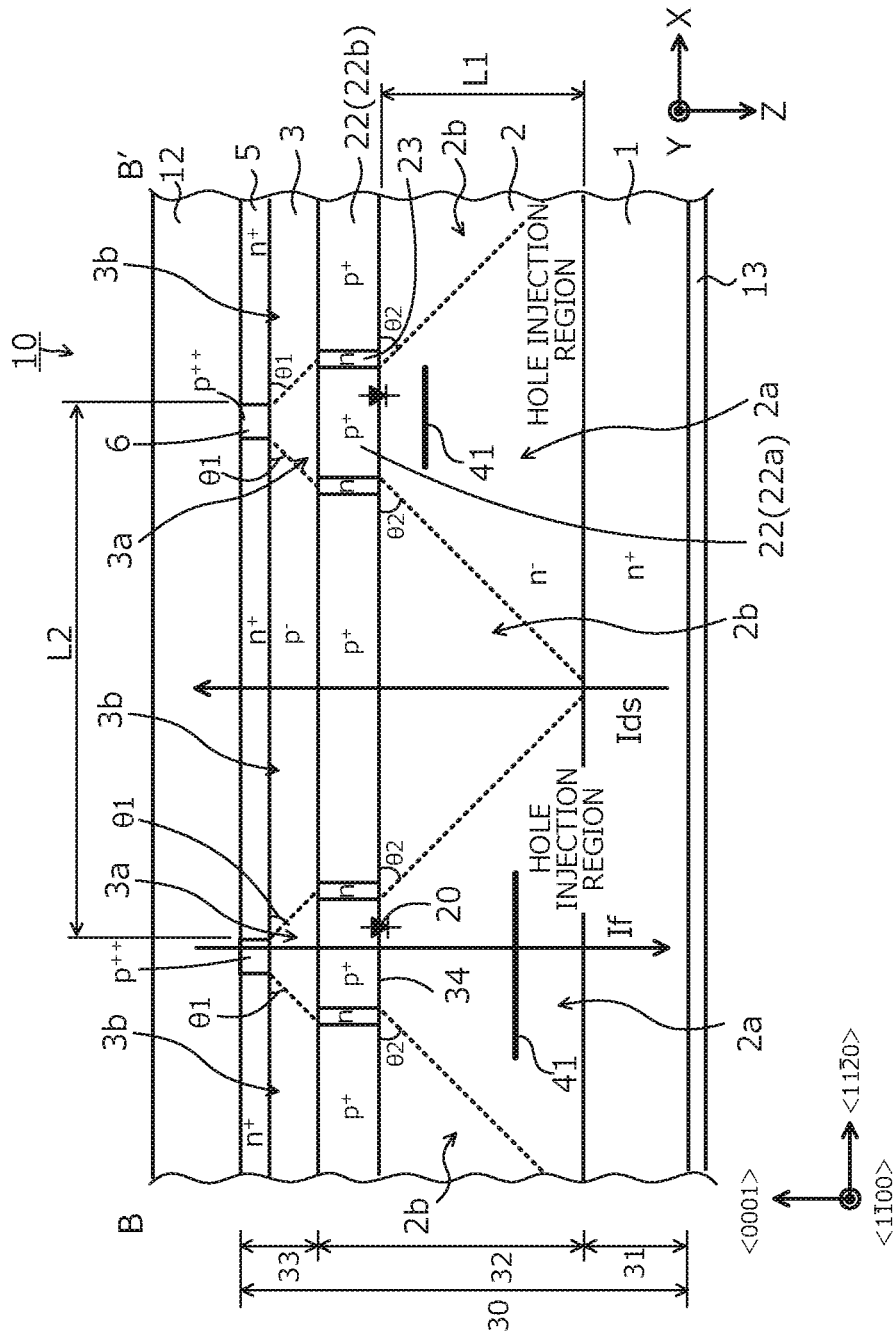
FIG. 3 is a cross-sectional view depicting the structure of the silicon carbide semiconductor device according to the embodiment.
Figure 4:
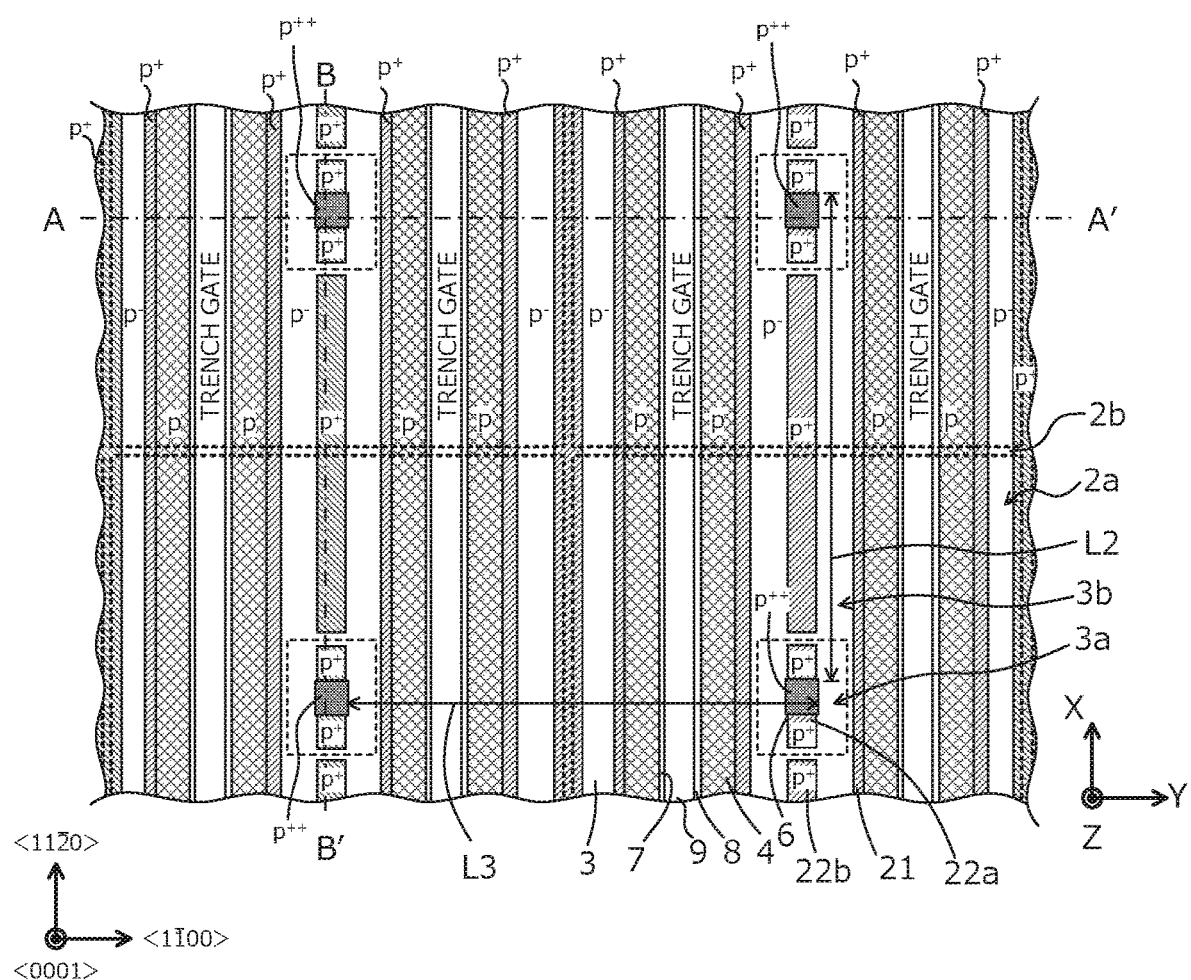
FIG. 4 is a plan view depicting a layout when a portion of the silicon carbide semiconductor device according to the embodiment is viewed from the front side of the semiconductor substrate thereof.

A structure of a silicon carbide semiconductor device according to an embodiment is described. FIG. 1 is a plan view depicting a layout when the silicon carbide semiconductor device according to the embodiment is viewed from a front side of a semiconductor substrate thereof. FIGS. 2 and 3 are cross-sectional views depicting the structure of the silicon carbide semiconductor device according to the embodiment. FIG. 4 is a plan view depicting a layout when a portion of the silicon carbide semiconductor device according to the embodiment is viewed from the front side of the semiconductor substrate thereof. FIGS. 2 and 3 depict cross-sections of the structure along cutting line A-A' and cutting line B-B' in FIG. 4, respectively. In FIG. 4, n⁺-type source regions 5 are not depicted so that a layout of p-type base regions 4, p⁺⁺-type contact regions 6, and p⁺-type regions 21, 22 is clearly depicted.

A silicon carbide semiconductor device 10 according to the embodiment depicted in FIGS. 1 to 4 is a vertical SiC-MOSFET having, in an active region 51 of a semiconductor substrate 30 thereof, a trench gate structure at a front side of the semiconductor substrate 30, which contains silicon carbide. The active region 51 is a region through which a main current (the drift current Ids) flows in a direction that is orthogonal to the front surface of the semiconductor substrate 30, when the silicon carbide semiconductor device 10 (SiC-MOSFET) is on. In the active region 51, multiple unit cells (functional units of the device) of the SiC-MOSFET, each having the same structure, are disposed adjacent to one another. In FIG. 2, four adjacent unit cells are depicted in the active region 51. The active region 51, for example, has a substantially rectangular shape in a plan view of the device and is provided in substantially a center (chip center) of the semiconductor substrate 30.

An edge termination region 52 is a region between the active region 51 and an end (chip end) of the semiconductor substrate 30. The edge termination region 52 surrounds a periphery of the active region 51 in substantially a rectangular shape in the plan view. The edge termination region 52 has a function of mitigating electric field at the front side of the semiconductor substrate 30 and sustaining a breakdown voltage. The breakdown voltage is a voltage use limit at which no malfunction or destruction of the silicon carbide semiconductor device 10 occurs. In the edge termination region 52, for example, a general voltage withstanding structure (not depicted) such as a field limiting ring (FLR), a junction termination extension (JTE) structure, etc. is disposed.

In the semiconductor substrate 30, epitaxial layers 32, 33 constituting an n⁻-type drift region (first semiconductor region) 2 and p⁻-type base regions (second semiconductor regions) 3, respectively, are sequentially formed by epitaxial growth on a front surface of an n⁺-type starting substrate 31 that contains silicon carbide. The semiconductor substrate 30 has, as a front surface, a first main surface that has the p⁻-type epitaxial layer 33 and as a back surface, a second main surface that has the n⁺-type starting substrate 31 (back surface of the n⁺-type starting substrate 31). The front surface of the n⁺-type starting substrate 31 is, for example, (0001) plane having an off-angle of about 4 degrees with the <11-20> direction. The n⁺-type starting substrate 31 constitutes an n⁺-type drain region 1. The trench gate structure is configured by the p⁻-type base regions 3, the p-type base regions 4, n⁺-type source regions (third semiconductor regions) 5, the p⁺⁺-type contact regions (fourth semiconductor regions) 6, gate trenches 7, gate insulating films 8, and gate electrodes 9.

The gate trenches 7 penetrate through the p⁻-type epitaxial layer 33 in the depth direction Z from the front surface of the semiconductor substrate 30, reach the n⁻-type epitaxial layer 32, and terminate in later-described n-type current spreading regions 23 (in an instance in which the n-type current spreading regions 23 are omitted, the n⁻-type drift region 2). The gate trenches 7 extend in a striped pattern in the first direction X, which is parallel to the front surface of the semiconductor substrate 30. A longitudinal direction (the first direction X) of the gate trenches 7, for example, is the <11-20> direction, a lateral direction (a second direction Y that is parallel to the front surface of the semiconductor substrate 30 and orthogonal to the first direction X) of the gate trenches 7, for example, is the <1-100> direction. The gate electrodes 9 (trench gates not depicted in FIG. 4) are provided in the gate trenches 7, via the gate insulating films 8.

Between the gate trenches 7 that are adjacent to one another (in mesa portions), the p⁻-type base regions 3, the p-type base regions 4, the n⁺-type source regions 5, and the p⁺⁺-type contact regions 6 are each selectively provided between the front surface of the semiconductor substrate 30 and the n⁻-type drift region 2. Body diodes 20 are formed by pn junctions 34 between the p⁺⁺-type contact regions 6, the p⁻-type base regions 3, the p-type base regions 4, later-described p⁺-type regions (second-conductivity-type high-concentration regions) 21, 22, the later-described n-type current spreading regions 23, the n⁻-type drift region 2, and the n⁺-type drain region 1. The forward current If of the body diodes 20 flows along a path that is from the p⁺⁺-type contact regions 6 and passes through later-described hole current regions (first region) 3a of the p⁻-type base regions 3, first portions 22a of the later-described p⁺-type regions 22, later-described hole injection regions (third region) 2a of the n⁻-type drift region 2, and the n⁺-type drain region 1.

The p-type base regions 4, the n⁺-type source regions 5, and the p⁺⁺-type contact regions 6 are diffused regions formed by ion implantation in the p⁻-type epitaxial layer 33. Portions of the p⁻-type epitaxial layer 33, excluding these diffused region formed by ion implantation, constitute the p⁻-type base regions 3. The p⁻-type base regions 3, the p-type base regions 4, and the n⁺-type source regions 5 are in contact with the gate insulating films 8 at sidewalls of the gate trenches 7. The p⁻-type base regions 3 extend linearly uninterrupted and have a length (length in the longitudinal direction) that is substantially equal to that of the gate trenches 7 in the first direction X, the p⁻-type base regions 3 reach the sidewalls of the gate trenches 7 that are adjacent to one another. The p⁻-type base regions 3, for example, are electrically connected to a source electrode (first electrode) 12 close to a border between the active region 51 and the edge termination region 52.

The p⁻-type base regions 3 have the hole current regions 3a through which the forward current (hole current) If of the body diodes 20 locally passes. The hole current regions 3a of the p⁻-type base regions 3 are regions that, in the p⁻-type base regions 3, include portions sandwiched between the p⁺⁺-type contact regions 6 and the later-described p⁺-type regions 22. Each of the hole current regions 3a of the p⁻-type base regions 3 forms a frustum (truncated cone) shape that has, as an upper base, an entire area of a contact surface thereof in contact with one of the p⁺⁺-type contact regions 6 and as a lower base (in FIG. 4, dashed lines surrounding the p⁺⁺-type contact regions 6), an entire area of a contact surface thereof in contact with one of the p⁺-type regions 22. The lower base of each of the hole current regions 3a (the frustum shape) is greater in size than the upper base. Thus, a width of each of the hole current regions 3a of the p⁻-type base regions 3, the width between facing portions of the side surface (cone surface: oblique dashed lines in the p⁻-type base regions 3 in FIGS. 2 and 3) in a cross-sectional view, increases in a direction to the p⁺-type regions 22 so that the side surface forms an angle θ1 of about 45 degrees with respect to the front surface of the semiconductor substrate 30.

An impurity concentration of the p⁻-type base regions 3 is not more than about $5 \times 10^{16}/cm^3$ in at least the hole current regions 3a. It is expected that by lowering the impurity concentration of the hole current regions 3a of the p⁻-type base regions 3, diffusion of the holes that flow into to the p⁻-type base regions 3 from the p⁺⁺-type contact regions 6 during conduction of the body diodes 20 may be reduced in the horizontal direction. As a result, the angle θ1 of the side surfaces of the hole current regions 3a of the p⁻-type base regions 3 with respect to the front surface of the semiconductor substrate 30 may be increased, thereby enabling size reductions of the semiconductor substrate 30. Thus, the impurity concentration of the hole current regions 3a of the p⁻-type base regions 3 may be, for example, in a lower range of $10^{16}/cm^3$ (preferably, in a $10^{15}/cm^3$ range).

The p-type base regions 4 are provided apart from the n⁺-type source regions 5 and the p⁺⁺-type contact regions 6, at positions deeper from the front surface of the semiconductor substrate 30 (closer to the n⁺-type drain region 1, the back surface of the semiconductor substrate 30) than are the n⁺-type source regions 5 and the p⁺⁺-type contact regions 6. Further, the p-type base regions 4 are provided apart from the later-described n-type current spreading regions 23 and the later-described p$^+$-type regions 22, at shallower positions from the front surface of the semiconductor substrate 30 (closer to the n$^+$-type source regions 5, the front surface of the semiconductor substrate 30) than are the later-described n-type current spreading regions 23 and the later-described p$^+$-type regions 22. In the depth direction Z, the p-type base regions 4 face the n$^+$-type source regions 5 but do not face the p$^{++}$-type contact regions 6. The p$^-$-type base regions 3 intervene between the p-type base regions 4 and the n$^+$-type source regions 5, and between the p-type base regions 4 and the n-type current spreading regions 23.

In a single mesa portion between an adjacent two of the gate trenches 7, two of the p-type base regions 4 are, respectively, disposed adjacent to the adjacent two of the gate trenches 7. The p-type base regions 4 extend linearly uninterrupted in the first direction X and have a length (length in the longitudinal direction) that is substantially equal to that of the gate trenches 7. In the single mesa portion, the hole current regions 3a of the p$^-$-type base regions 3 disposed apart from each other in the second direction Y and intervene between the p-type base regions 4 that are, respectively, adjacent to the adjacent two of the gate trenches 7, and are disposed apart from each other in the first direction X and intervene between the p-type base regions 4. Each of the p-type base regions 4 is disposed apart from the hole current regions 3a of the p$^-$-type base regions 3, and a periphery thereof, excluding a portion in contact with the gate insulating films 8, is surrounded by one of the p$^-$-type base regions 3. The p-type base regions 4 may be omitted.

The n$^+$-type source regions 5 and the p$^{++}$-type contact regions 6 are selectively provided between the front surface of the semiconductor substrate 30 and the p$^-$-type base regions 3. The n$^+$-type source regions 5 and the p$^{++}$-type contact regions 6 each has a lower surface (surface facing the n$^+$-type drain region 1) that is in contact with the p$^-$-type base regions 3 and each is in ohmic contact with the source electrode 12 at the front surface of the semiconductor substrate 30. The n$^+$-type source regions 5 are provided adjacent to the gate trenches 7, extend uninterrupted in the first direction X, and have substantially the same length as that of the gate trenches 7. When viewed from the front side of the semiconductor substrate 30, arrangement of the n$^+$-type source regions 5 is in a ladder-like pattern (lattice-like pattern) surrounding peripheries of the p$^{++}$-type contact regions 6 that are scattered in the first direction X, as described hereinafter (not depicted).

The p$^{++}$-type contact regions 6 are provided in substantially a center of the mesa portions in the second direction Y, apart from the gate trenches 7 and are adjacent to the n$^+$-type source regions 5 in a direction parallel to the front surface of the semiconductor substrate 30. The p$^{++}$-type contact regions 6, at the entire lower surfaces thereof, are in contact with the hole current regions 3a of the p$^-$-type base regions 3. The p$^-$-type base regions 3, the p-type base regions 4, and the later-described p$^+$-type regions 22, at respective predetermined locations, are electrically connected to the source electrode 12 and directly beneath the hole current regions 3a of the p$^-$-type base regions 3, the later-described hole injection regions 2a of the n$^-$-type drift region 2 suffice to be disposed in a matrix-like pattern; with respect to all the mesa portions, one or more of the p$^{++}$-type contact regions 6 may be disposed in each or some mesa portions may be free of the p$^{++}$-type contact regions 6.

The p$^{++}$-type contact regions 6 are disposed at a predetermined pitch L2 in the first direction X and at a predetermined pitch L3 in the second direction Y, any adjacent two of the p$^{++}$-type contact regions 6 sandwich one or more of the gate trenches 7 in the second direction Y. Two or more of the mesa portions that are free of the p$^{++}$-type contact regions 6 may be disposed adjacently in the second direction Y. In this manner, the p$^{++}$-type contact regions 6 are disposed in island-like shapes apart from one another at the surface of the active region 51, whereby the cell pitch may be reduced. In addition, in the n$^-$-type drift region 2, between the hole injection regions 2a thereof that are adjacent to one another, regions (fourth regions) 2b that are free of holes (not injected with holes) during conduction of the body diodes 20 are formed so as to be in contact with the n$^+$-type drain region 1 and surround peripheries of the hole injection regions 2a.

The predetermined pitches L2, L3 of the arrangement of the p$^{++}$-type contact regions 6 are at least about two times a thickness L1 of the n$^-$-type drift region 2 (L2≥2×L1, L3≥2×L1). As a result, the later-described hole injection regions 2a of the n$^-$-type drift region 2 are formed apart from one another. On the other hand, when the pitches L2, L3 of the arrangement of the p$^{++}$-type contact regions 6 are too wide, parasitic npn bipolar transistors (BJTs) formed by the n$^+$-type source regions 5, the p$^-$-type base regions 3, the p-type base regions 4, the later-described n-type current spreading regions 23, the n$^-$-type drift region 2, and the n$^+$-type drain region 1 may operate. Thus, the pitches L2, L3 of the arrangement of the p$^{++}$-type contact regions 6 are set to be sufficiently narrow so that the npn BJTs do not operate.

The pitches L2, L3 of the arrangement of the p$^{++}$-type contact regions 6 may be the same in both the first and second directions X, Y, or may be different. Arrangement by substantially the same pitch means arrangement by the same pitch within a range that includes an allowable error due to manufacturing process variation. The thickness L1 of the n$^-$-type drift region 2 is a length from the later-described n-type current spreading regions 23 (in an instance in which the n-type current spreading regions 23 are omitted, the later-described p$^+$-type regions 21, 22) to the n$^+$-type drain region 1. A shape of the p$^{++}$-type contact regions 6 in a plan view, for example, may be suitably set and may be rectangular (FIG. 4), circular (not depicted), etc. Between the p$^-$-type base regions 3 and the n$^-$-type drift region 2, the p$^+$-type regions 21, 22 and the n-type current spreading regions 23 are each selectively provided at positions closer to the n$^+$-type drain region 1 than are the bottoms of the gate trenches 7.

The p$^+$-type regions 21, 22 and the n-type current spreading regions 23 are diffused regions formed by ion implantation in the n$^-$-type epitaxial layer 32. The p$^+$-type regions 21, 22 are fixed to the potential of the source electrode 12, deplete (or cause the n-type current spreading regions 23 to deplete, or both) when the SiC-MOSFET (the silicon carbide semiconductor device 10) is off, and have a function of mitigating electric field applied to the gate insulating films 8. The p$^+$-type regions 21, 22, at lower surfaces thereof, are in contact with the n$^-$-type drift region 2 and terminate at a same depth as that of the n-type current spreading regions 23, in a direction to the n$^+$-type drain region 1. The n-type current spreading regions 23 may extend between the p$^+$-type regions 21, 22 and the n$^-$-type drift region 2.

The p$^+$-type regions 21 are provided apart from the p$^-$-type base regions 3 and face the bottoms of the gate trenches 7 in the depth direction Z. The p$^+$-type regions 21 may be in contact with the gate insulating films 8 at the bottoms of the gate trenches 7 or may be apart from the gate trenches 7. The p$^+$-type regions 21 extend linearly uninterrupted in the first direction X and have the same length as that of the gate trenches 7. The p$^+$-type regions 21, at the lower surfaces thereof, are in contact with the regions 2*b* (of the n⁻-type drift region 2) that are free of holes. The p⁺-type regions 21 are electrically connected to the source electrode 12 by portions not depicted. In an instance in which the p⁺-type regions 21 are electrically connected to the source electrode 12 via the p⁺-type regions 22, the p⁺-type regions 21 are connected by later-described second portions 22*b* of the p⁺-type regions 22.

Between the gate trenches 7 that are adjacent to one another, the p⁺-type regions 22 are provided apart from the gate trenches 7 and the p⁺-type regions 21. The p⁺-type regions 22 are disposed in substantially centers of the mesa portions (between the gate trenches 7 that are adjacent to each other) in the second direction Y and face the p⁺⁺-type contact regions 6 in the depth direction Z. The p⁺-type regions 22, at the upper surfaces thereof (surfaces facing the n⁺-type source regions 5), are in contact with the p⁻-type base regions 3 and are electrically connected to the source electrode 12, via the p⁻-type base regions 3 and the p⁺⁺-type contact regions 6. Further, the p⁺-type regions 22 extend linearly in the first direction X and are partially discontinuous (disconnected) directly beneath the outer peripheries (in FIGS. 3 and 4, dashed lines in the p⁻-type base regions 3) of the hole current regions 3*a* of the p⁻-type base regions 3.

In particular, the p⁺-type regions 22 have the first portions 22*a* that are adjacent to the hole current regions 3*a* of the p⁻-type base regions 3 in the depth direction Z and the second portions 22*b* that exclude the first portions 22*a*. The second portions 22*b* of the p⁺-type regions 22, in the depth direction Z, are adjacent to only regions (plurality of second regions) 3*b* of the p⁻-type base regions 3 other than the hole current regions 3*a* and are apart from the hole current regions 3*a*. Thus, the first and second portions 22*a*, 22*b* of the p⁺-type regions 22 repeatedly alternate with one another and are disposed apart from one another in the first direction X according to the pitch L3 of the arrangement of the p⁺⁺-type contact regions 6 in the second direction Y. In the mesa portions that are free of the p⁺⁺-type contact regions 6, only the second portions 22*b* of the p⁺-type regions 22 are disposed. The n-type current spreading regions 23 intervene between the first and second portions 22*a*, 22*b* of the p⁺-type regions 22.

A width of the p⁺-type regions 22 in the second direction Y is suitably set according to a width (in the second direction Y) of a JFET (Junction FET) portion between an adjacent two of the p⁺-type regions 21, 22 and may be at least equal to the width of the p⁺⁺-type contact regions 6 in the second direction Y or narrower than the width of the p⁺⁺-type contact regions 6 in the second direction Y. Each of the p⁺-type regions 22 may have a two-layer structure including a portion that faces the n⁺-type drain region 1 and a portion that faces the n⁺-type source regions 5 and has an impurity concentration that is substantially equal to that of the portion that faces the n⁺-type drain region 1 (for example, about $1\times10^{18}/cm^3$) or may have a two-layer structure including the portion that faces the n⁺-type drain region 1 and the portion that faces the n⁺-type source regions 5 and has an impurity concentration different from that of the portion that faces the n⁺-type drain region 1.

The n-type current spreading regions 23 is a so-called current spreading layer (CSL) that reduces carrier spreading resistance. The n-type current spreading regions 23 are adjacent to the p⁺-type regions 21, 22, have upper surfaces in contact with the p⁻-type base regions 3, and lower surfaces in contact with the n⁻-type drift region 2. Further, the n-type current spreading regions 23 reach the gate trenches 7 in the second direction Y and are in contact with the gate insulating films 8. The n-type current spreading regions 23 may be omitted. In an instance in which the n-type current spreading regions 23 are omitted, instead of the n-type current spreading regions 23, the regions 2*b* (of the n⁻-type drift region 2) that are free of holes reach the p⁻-type base regions 3 between the p⁺-type regions 21, 22 that are adjacent to one another and in the second direction Y, reach the gate trenches 7 and are in contact with the gate insulating films 8.

Portions of the n⁻-type epitaxial layer 32 excluding diffused regions (the p⁺-type regions 21, 22, and the n-type current spreading regions 23) formed by ion implantation constitute the n⁻-type drift region 2. The n⁻-type drift region 2 has the hole injection regions 2*a*, which are injected with holes when the body diodes 20 conduct. The hole injection regions 2*a* of the n⁻-type drift region 2 are regions that include portions of the n⁻-type drift region 2, sandwiched by the n⁺-type drain region 1 and the first portions 22*a* of the p⁺-type regions 22. Each of the hole injection regions 2*a* of the n⁻-type drift region 2 has a frustum shape in which an entire area of a contact surface in contact with the first portions 22*a* of the p⁺-type regions 22 is the upper base thereof and a contact surface in contact with the n⁺-type drain region 1 is the lower base thereof (in FIG. 4, dashed lines surrounding the hole current regions 3*a*) thereof. The lower base is greater in size than the upper base of each of the hole injection regions 2*a* (the frustum shape).

A width of each of the hole injection regions 2*a* of the n⁻-type drift region 2, the width between facing portions of the side surface (cone surface, in FIGS. 2 and 3, oblique dashed lines in the n⁻-type drift region 2) in a cross-sectional view, increases in a direction to the n⁺-type drain region 1 so that the side surface forms an angle θ2 of about 45 degrees with respect to the front surface of the semiconductor substrate 30. The hole injection regions 2*a* of the n⁻-type drift region 2 are disposed apart from one another, and the regions 2*b*, which are free of holes, intervene between the hole injection regions 2*a* that are adjacent to one another. In the n⁻-type drift region 2, each of the regions 2*b*, which are free of holes, has an upper surface that is in contact with the p⁺-type regions 21, the second portions 22*b* of the p⁺-type regions 22, and the n-type current spreading regions 23, and a lower surface that is in contact with the n⁺-type drain region 1. During conduction of the body diodes 20, holes are injected only into the hole injection regions 2*a* of the n⁻-type drift region 2 and the holes are present therein at a critical concentration of $1\times10^{15}/cm^3$ or greater.

An interlayer insulating film 11 is provided in an entire area of the front surface of the semiconductor substrate 30 and covers the gate electrodes 9. The n⁺-type source regions 5 and the p⁺⁺-type contact regions 6 are exposed in contact holes of the interlayer insulating film 11. The source electrode 12 is in ohmic contact with the n⁺-type source regions 5 and the p⁺⁺-type contact regions 6 in the contact holes of the interlayer insulating film 11 and is electrically connected to the n⁺-type source regions 5, the p⁺⁺-type contact regions 6, the p⁻-type base regions 3, the p-type base regions 4, and the p⁺-type regions 21, 22. A drain electrode (second electrode) 13 is provided in an entire area of the back surface (back surface of the n⁺-type starting substrate 31) of the semiconductor substrate 30 and is electrically connected to the n⁺-type drain region 1.

Figure 5:
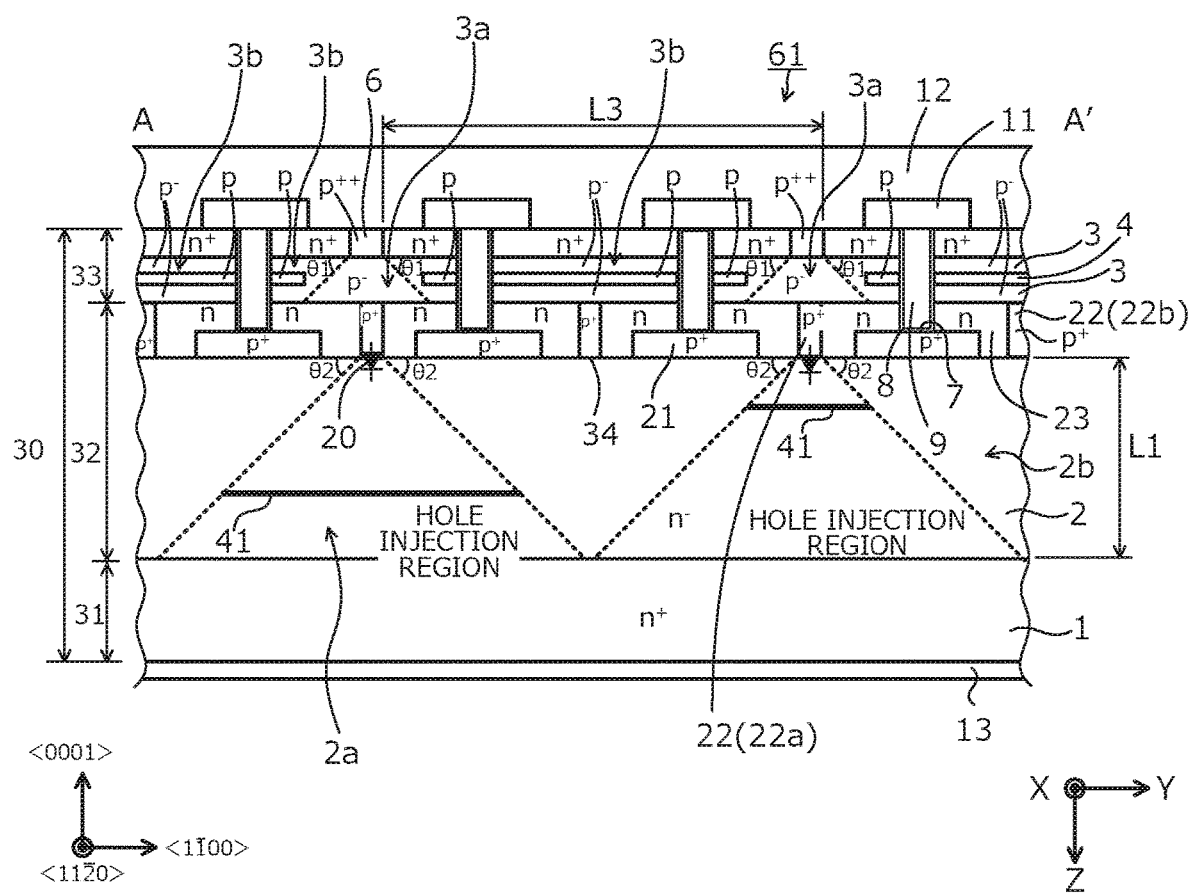
FIG. 5 is a cross-sectional view of another example of the structure of the silicon carbide semiconductor device according to the embodiment.
Figure 6:
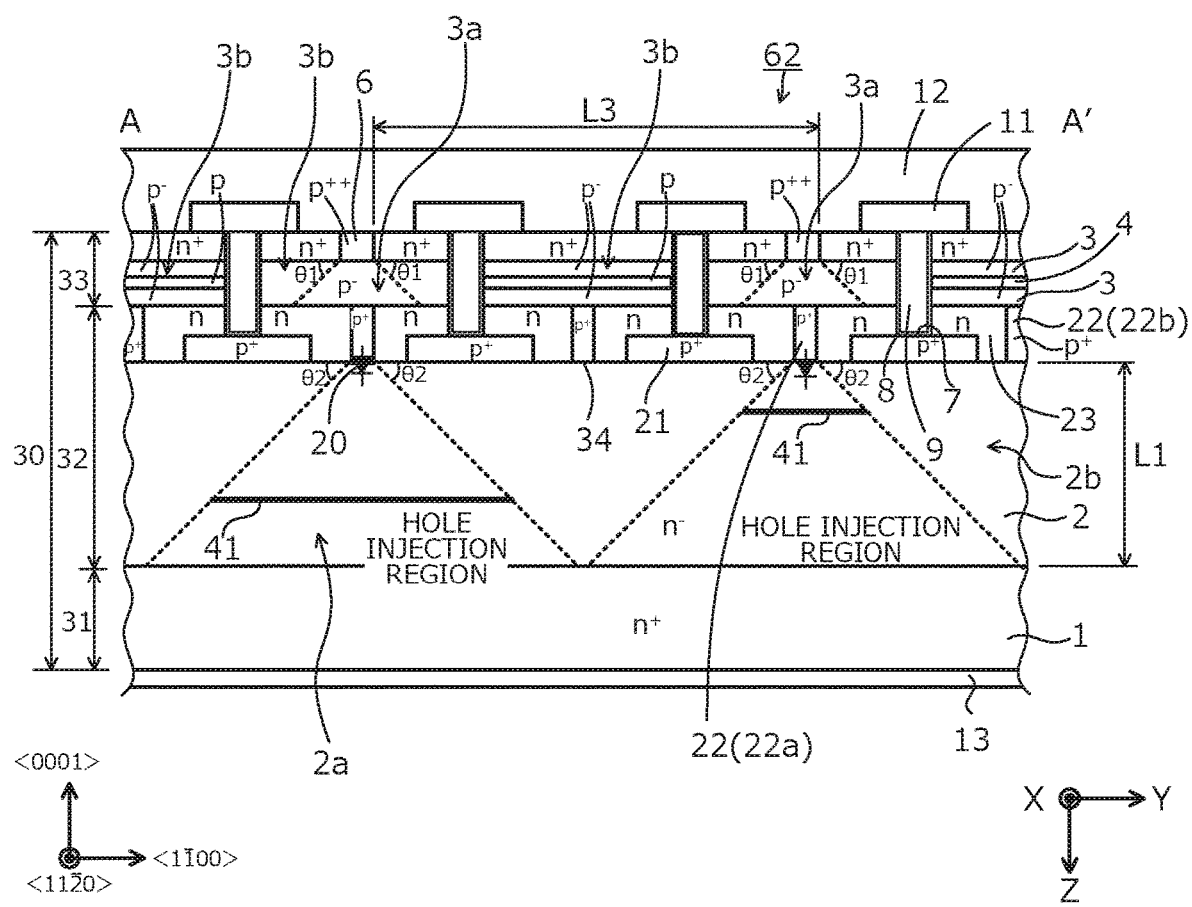
FIG. 6 is a cross-sectional view of another example of the structure of the silicon carbide semiconductor device according to the embodiment.
Figure 7:
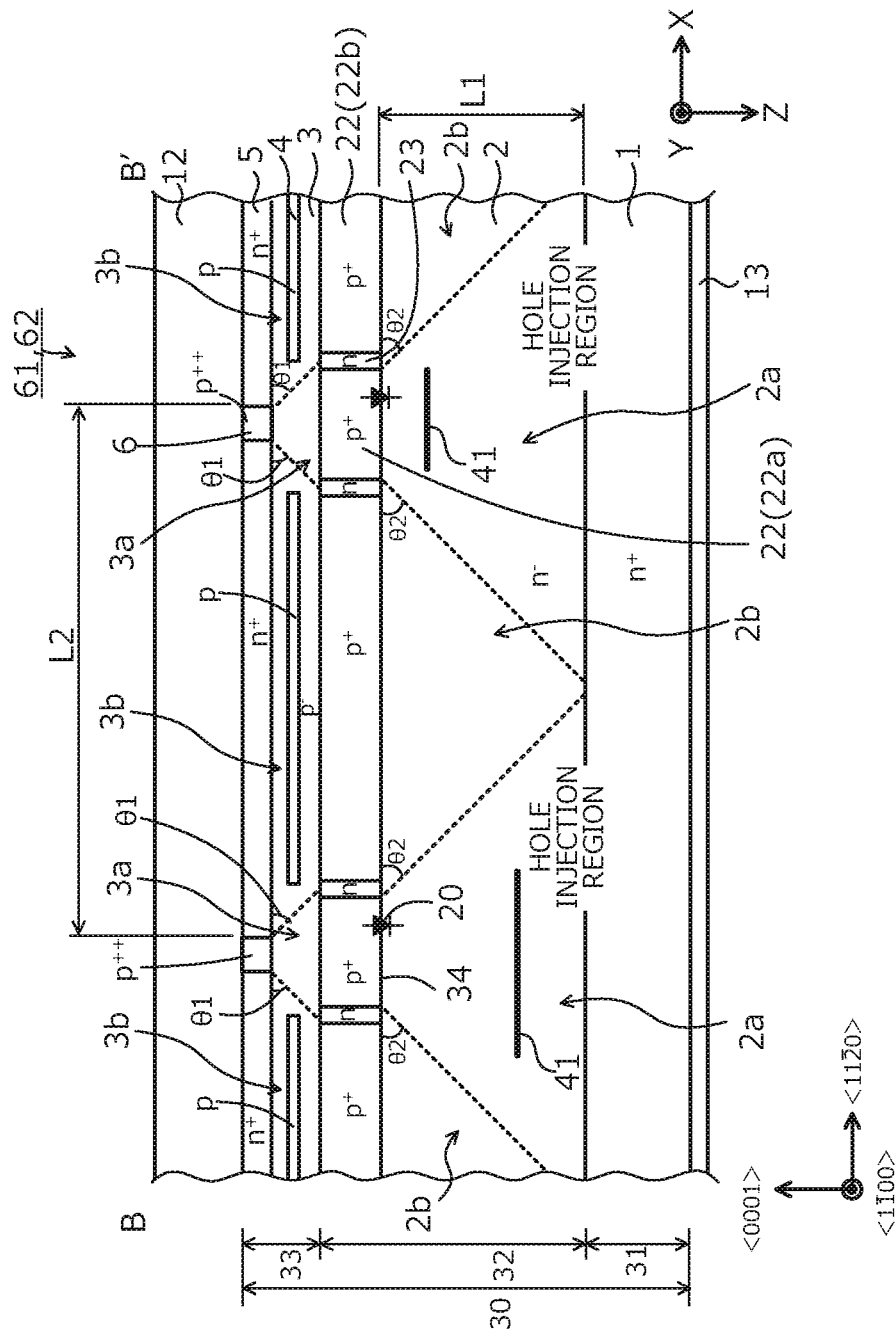
FIG. 7 is a cross-sectional view of another example of the structure of the silicon carbide semiconductor device according to the embodiment.
Figure 8:
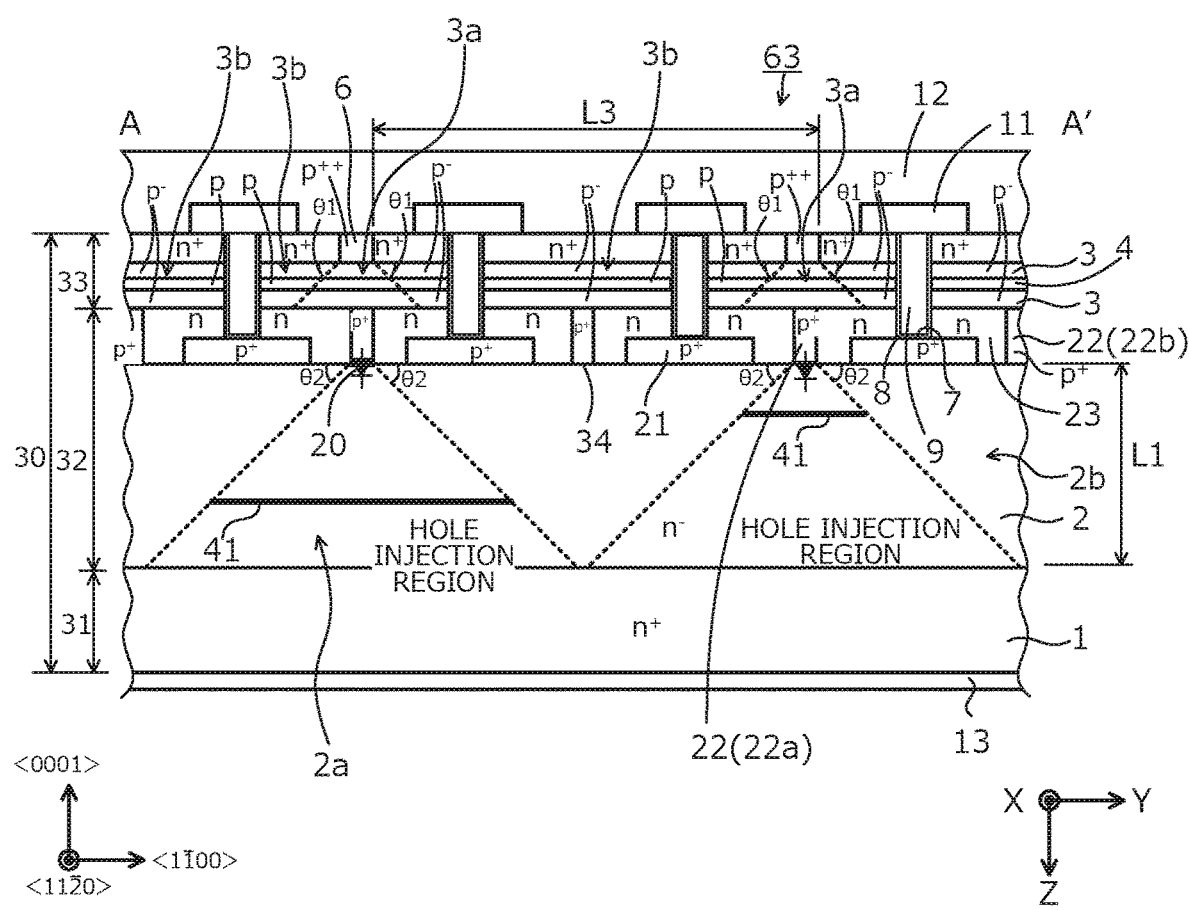
FIG. 8 is a cross-sectional view of another example of the structure of the silicon carbide semiconductor device according to the embodiment.
Figure 9:
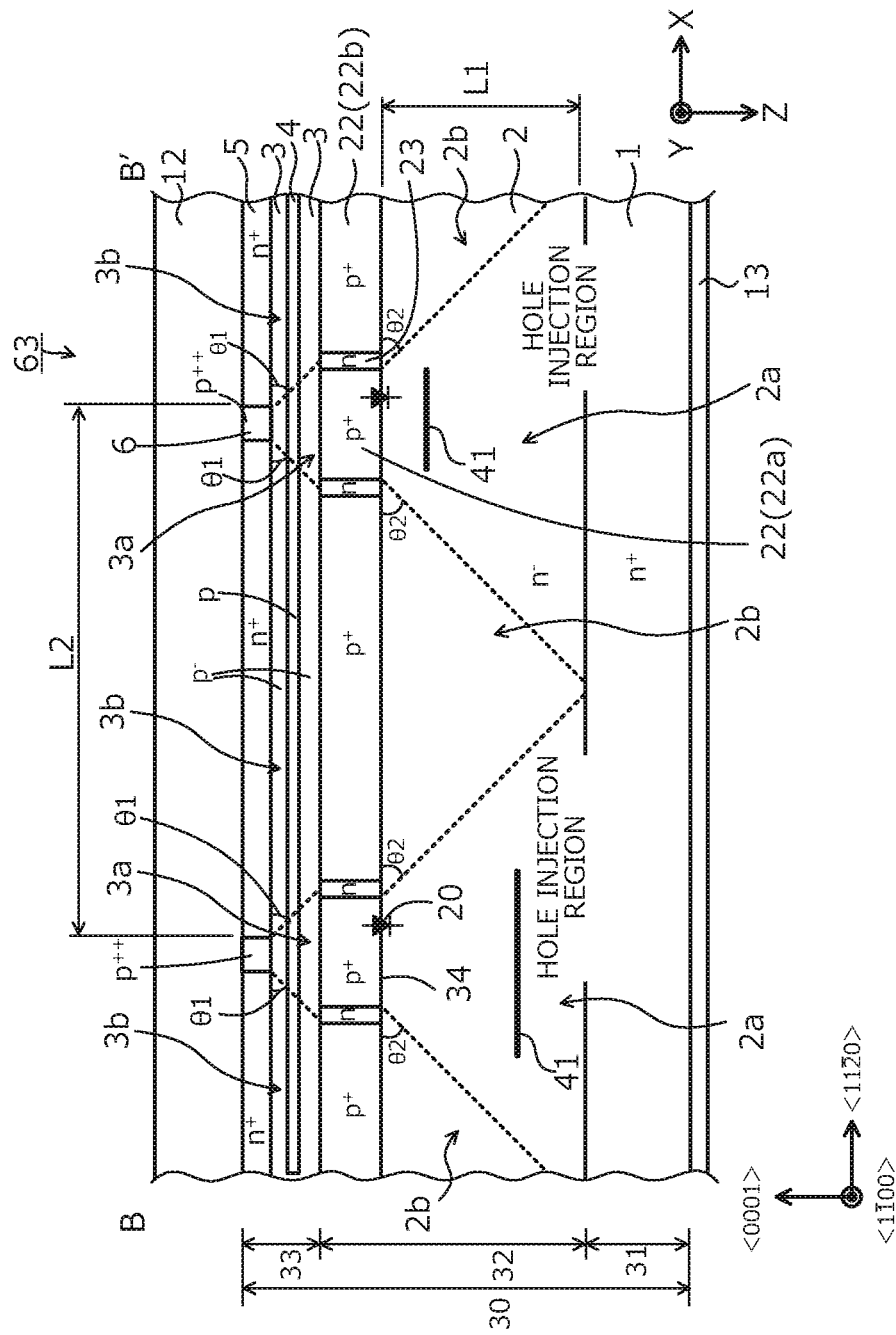
FIG. 9 is a cross-sectional view of another example of the structure of the silicon carbide semiconductor device according to the embodiment.

FIGS. 5, 6, 7, 8, and 9 are cross-sectional views of other examples of the structure of the silicon carbide semiconductor device according to the embodiment. For each of the silicon carbide semiconductor devices 61, 62, 63 according to the embodiment depicted in FIGS. 5 to 9, a layout of portions (the p⁻-type base regions 3, the n⁺-type source regions 5 (not depicted), the p⁺⁺-type contact regions 6, and the p⁺-type regions 21, 22) excluding the p-type base regions 4 of a mesa portion between any adjacent two of the gate trenches 7 is similar to that in FIG. 4. FIGS. 5, 6, and 8 correspond to a cross-section of the structure along cutting line A-A' in FIG. 4. FIGS. 7 and 9 correspond to a cross-section of the structure along cutting line B-B' in FIG. 4.

In the silicon carbide semiconductor devices 61, 62, 63 according to the embodiment depicted in FIGS. 5 to 9, a layout of the p-type base regions 4 differs from that of the silicon carbide semiconductor device 10 according to the embodiment depicted in FIGS. 2 and 3. In particular, as depicted, in the silicon carbide semiconductor device 61 according to the embodiment depicted in FIGS. 5 and 7, in the silicon carbide semiconductor device 62 according to the embodiment depicted in FIGS. 6 and 7, and in the silicon carbide semiconductor device 63 according to the embodiment depicted in FIGS. 8 and 9, between the hole current regions 3a that are adjacent to one another in the first direction X, the p-type base regions 4 may be disposed spanning between the gate trenches 7 that are adjacent to one another.

In this instance, the p-type base regions 4 may be disposed in a ladder-like pattern surrounding the peripheries of the hole current regions 3a (FIGS. 5, 7). Alternatively, the p-type base regions 4 may be disposed between only the hole current regions 3a that are adjacent to one another in the first direction X, so that the hole current regions 3a and the p-type base regions 4 are not adjacent to one another in the second direction Y (FIGS. 6, 7). While not depicted, the p-type base regions 4 may extend linearly in the first direction X, in a state of being partially discontinuous (disconnected) only in a vicinity of the sidewalls of the gate trenches 7 so not to be adjacent to the hole current regions 3a in the first or second directions X, Y.

Alternatively, the p-type base regions 4 may be disposed in an entire area between the gate trenches 7 that are adjacent to one another, so that each of the p⁻-type base regions 3 is separated, by the p-type base regions 4, into a portion facing the n⁺-type source regions 5 and a portion facing the n⁺-type drain region 1 (FIGS. 8 and 9). In this instance, while the p-type base regions 4 are further disposed in the hole current regions 3a, a total impurity concentration of the impurity concentration of the hole current regions 3a and the impurity concentration of the p-type base regions 4 disposed in the hole current regions 3a suffices to be set to be within the range (about $5 \times 10^{16}/\text{cm}^3$ or less) described above.

Operation of the silicon carbide semiconductor device 10 according to the embodiment (SiC-MOSFET) is described. During normal operation, voltage that is positive with respect to the source electrode 12 is applied to the drain electrode 13 (state of forward bias between the drain and source) and the pn junctions 34 between the p⁺⁺-type contact regions 6, the p⁻-type base regions 3, the p-type base regions 4, the p⁺-type regions 21, 22, the n-type current spreading regions 23, the n⁻-type drift region 2, and the n⁺-type drain region 1 are reverse biased. In this state, when the voltage applied to the gate electrodes 9 is less than the gate threshold voltage, the SiC-MOSFET maintains the off state.

On the other hand, in a state of forward bias between the drain and source, when voltage that is at least equal to the gate threshold voltage is applied to the gate electrodes 9, a channel (n-type inversion layer) is formed at portions of the p⁻-type base regions 3 and the p-type base regions 4 along the sidewalls of the gate trenches 7. As a result, the drift current Ids flows from the n⁺-type drain region 1 through the n⁻-type drift region 2, the n-type current spreading regions 23, and the channel, to the n⁺-type source regions 5 and the SiC-MOSFET (the silicon carbide semiconductor device 10) turns on.

Further, during dead time during synchronous rectification of SiC-MOSFETs and during energy regeneration to a load side by the SiC-MOSFET, regions between the drain and source are reverse biased. Thus, the pn junctions 34 between the p⁺⁺-type contact regions 6, the p⁻-type base regions 3, the p-type base regions 4, the p⁺-type regions 21, 22, the n-type current spreading regions 23, the n⁻-type drift region 2, and the n⁺-type drain region 1 are forward biased, the body diodes 20 conduct, and the forward current If flows in a direction from the p⁺⁺-type contact regions 6 to the n⁻-type drift region 2.

In particular, first, the forward current If of the body diodes 20 flows into the p⁻-type base regions 3 from the p⁺⁺-type contact regions 6. The impurity concentration of the p⁻-type base regions 3 (the p⁻-type epitaxial layer 33) is about $5 \times 10^{16}/\text{cm}^3$ or less and thus, the forward current If flows downward (toward the n⁺-type drain region 1) through the p⁻-type base regions 3, at a spreading angle of about 45 degrees with respect to the front surface of the semiconductor substrate 30 and does not spread in the p⁻-type base regions 3 and the p-type base regions 4 in the horizontal direction (direction parallel to the front surface of the semiconductor substrate 30).

In other words, in the p⁻-type base regions 3, the forward current If of the body diodes 20 flows in the downward direction only through the hole current regions 3a, which have a frustum shape and are directly beneath the p⁺⁺-type contact regions 6, and from the hole current regions 3a, the forward current If flows into the p⁺-type regions 22 directly below. The p⁺-type regions 22 are in a state in which the first portions 22a thereof directly beneath the hole current regions 3a are apart from the second portions 22b thereof. Thus, the forward current If of the body diodes 20 flows only through the first portions 22a of the p⁺-type regions 22 and from the first portions 22a, flows into the n⁻-type drift region 2.

The second portions 22b of the p⁺-type regions 22 and the p⁺-type regions 21 are not connected to the hole current regions 3a and thus, the forward current If of the body diodes 20 does not flow therethrough. The forward current If that flows into the n⁻-type drift region 2 flows downward through the n⁻-type drift region 2 at the spreading angle of about 45 degrees (=θ2) with respect to the front surface of the semiconductor substrate 30 and does not spread in the n⁻-type drift region 2 in the horizontal direction. In other words, in the n⁻-type drift region 2, the holes are injected only into the hole injection regions 2a, which have the frustum shape and are directly beneath the first portions 22a of the p⁺-type regions 22.

Thus, the holes are present only in the hole injection regions 2a of the n⁻-type drift region 2 at the critical concentration $1 \times 10^{15}/\text{cm}^3$ or greater. Further, the p⁺⁺-type contact regions 6 are disposed at the predetermined pitches L2, L3, whereby in the n⁻-type drift region 2, between the hole injection regions 2a that are adjacent to one another, the regions 2b that are free of holes are formed. Thus, recombination of the holes and electrons occurs only in the hole injection regions 2a of the n⁻-type drift region 2 and due to this recombination, energy such as light closer to the band gap of silicon carbide is emitted.

Basal plane dislocations of the semiconductor substrate 30 receive the energy from the recombination, grow along the (0001) plane, at an angle that corresponds to the off angle in the <11-20> direction, the basal plane dislocations grow in the hole injection regions 2a of the n⁻-type drift region 2, up to a vicinity of an interface with the p⁺-type regions 22, and further expand in the <1-100> direction in the hole injection regions 2a. The regions 2b that are adjacent to the hole injection regions 2a are free of holes and thus, expansion of stacking faults 41 (bold lines) stops at the borders between the hole injection regions 2a and the regions 2b. Thus, the stacking faults 41 only grow and expand in the hole injection regions 2a.

As described above, according to the embodiment, the impurity concentration of the p⁻-type base region is not more than about $5\times10^{16}/cm^3$ in at least the hole current regions, which have the frustum shape and are directly beneath the p⁺⁺-type contact regions. In addition, the p⁺-type regions (hereinafter, p⁺-type regions between the gate trenches) for mitigating electric field applied to the gate insulating films at the bottoms of the gate trenches and disposed between the adjacent gate trenches are separated into first portions that are adjacent to the hole current regions of the p⁻-type base region in the depth direction and second portions that exclude the first portions.

As a result, forward current of the body diodes of the SiC-MOSFET only flows through the hole current regions of the p⁻-type base region and does not spread in the p⁻-type base region, in the horizontal direction. The forward current of the body diodes flows into the n⁻-type drift region from the hole current regions of the p⁻-type base region, through only the first portions of the p⁺-type regions between the gate trenches, and flows in a downward direction at the predetermined spreading angle in the n⁻-type drift region, whereby in the n⁻-type drift region, hole injection regions into which holes are locally injected and regions that are free of holes (not injected with holes) are formed.

Stacking faults only grow and expand in the hole injection regions of the n⁻-type drift region and expansion of the stacking faults may be stopped by the border between the hole injection regions and the regions that are free of holes, whereby the stacking faults do not expand in the n⁻-type drift region overall, in the active region. Thus, as compared to the conventional structure (refer to FIGS. 13 and 14), in the n⁻-type drift region of the active region, stacking faults, which constitute resistance components with respect to electron flow may be reduced and conduction loss may be suppressed, whereby bipolar degradation may be suppressed.

In the foregoing, the present invention is not limited to the embodiments described above and various modifications are possible within a range not departing from the spirit of the invention. For example, application is possible to a trench-gate-type SiC-MOSFET with a configuration that is free of the p⁺-type regions for mitigating electric field between the gate trenches and a trench-gate-type SiC-MOSFET with a configuration that is free of the p⁺-type regions for mitigating electric field between the gate trenches and provided directly beneath the gate trenches. In this case, the hole injection regions of the n⁻-type drift region are in contact with the lower surfaces of the hole current regions of the p⁻-type base region and form frustum shapes that have, as the upper base thereof, the lower surfaces of the hole current regions of the p⁻-type base region.

Further, in the embodiment described, while an example is described in which the side surface of each of the hole current regions of the p⁻-type base region and the side surface each of the hole injection regions of the n⁻-type drift region form an angle of about 45 degrees with respect to the front surface of the semiconductor substrate, the angle between the side surface of each of the hole injection regions and the front surface of the semiconductor substrate is expected to increase (that is, spreading of holes in the horizontal direction decreases) the lower is the impurity concentration of the p⁺⁺-type contact regions and thus, the angle may be suitably set corresponding to the impurity concentration of the p⁺⁺-type contact regions.

According to the invention described above, holes are injected only into the third regions of the first semiconductor region when the body diodes conduct, stacking faults grow and expand only in the third regions and expansion of the stacking faults is stopped by the border between the third regions and the fourth regions, whereby the stacking faults do not expand in the first semiconductor region overall.

The silicon carbide semiconductor device according to the present invention achieves an effect in that bipolar degradation may be suppressed.

As described, the silicon carbide semiconductor device according to the present invention is useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
  a semiconductor substrate containing silicon carbide and having a first main surface and a second main surface that are opposite to each other;
  a first semiconductor region of a first conductivity type, provided in the semiconductor substrate;
  a second semiconductor region of a second conductivity type, provided between the first main surface of the semiconductor substrate and the first semiconductor region;
  a third semiconductor region of the first conductivity type, selectively provided between the first main surface and the second semiconductor region;
  a plurality of fourth semiconductor regions of the second conductivity type, selectively provided between the first main surface and the second semiconductor region, the plurality of fourth semiconductor regions having an impurity concentration that is higher than an impurity concentration of the second semiconductor region;
  a trench penetrating through the third semiconductor region and the second semiconductor region and reaching the first semiconductor region;
  a gate insulating film provided in the trench;
  a gate electrode provided on the gate insulating film, in the trench;
  a first electrode electrically connected to the third semiconductor region and the second semiconductor region; and
  a second electrode electrically connected to the second main surface of the semiconductor substrate, wherein
  the plurality of fourth semiconductor regions are disposed apart from one another in island-like shapes, and
  the second semiconductor region has a plurality of first regions, each of which faces at least a corresponding one of the plurality of fourth semiconductor regions in a depth direction, the impurity concentration in the plurality of first regions being not more than $5\times10^{16}/cm^3$.

2. The silicon carbide semiconductor device according to claim 1, wherein
each of the plurality of first regions forms a frustum shape having an upper base that is a contact surface in contact with a corresponding one of the plurality of fourth semiconductor regions and a lower base that is greater in size than the upper base and opposite to the upper base in a depth direction, so that a width of the frustum shape gradually increases in the depth direction from the upper base toward the lower base in a cross-sectional view.

3. The silicon carbide semiconductor device according to claim 1, further comprising
a second-conductivity-type high-concentration region selectively provided between the second semiconductor region and the first semiconductor region, closer to the second main surface of the semiconductor substrate than is a bottom of the trench, the second-conductivity-type high-concentration region having an impurity concentration that is higher than the impurity concentration of the second semiconductor region, wherein
the second semiconductor region has a second region that excludes the first region,
the second-conductivity-type high-concentration region has:
a first portion that is in contact with one of the plurality of first regions, and
a second portion disposed apart from the first region and the first portion, the second portion being in contact with the second region.

4. The silicon carbide semiconductor device according to claim 3, wherein
the plurality of fourth semiconductor regions are apart from one another by at least two times a thickness of the first semiconductor region.

5. The silicon carbide semiconductor device according to claim 3, wherein the first semiconductor region has:
a third region that is in contact with the first portion, holes from the second semiconductor region are injected into the third region when a pn junction between the second-conductivity-type high-concentration region and the first semiconductor region is forward biased, and
a fourth region that is in contact with the second portion and surrounds a periphery of the third region, the fourth region being free of the holes injected from the second semiconductor region into the third region when the pn junction is forward biased.

6. The silicon carbide semiconductor device according to claim 5, wherein
the third region forms a frustum shape having an upper base that is a contact surface in contact with the first portion and a lower base that is greater in size than the upper base and opposite to the upper base in a depth direction, so that a width of the frustum shape gradually increases in the depth direction from the upper base toward the lower base in a cross-sectional view.

* * * * *